(12) United States Patent
Mori et al.

(10) Patent No.: US 6,451,879 B1
(45) Date of Patent: Sep. 17, 2002

(54) PHENOLIC RESIN, EPOXY RESIN, AND PROCESSES FOR PRODUCING THESE

(75) Inventors: Satoshi Mori, Yokohama; Fumiaki Oshimi, Atsugi; Ryuichi Ueno, Yokohama, all of (JP)

(73) Assignee: Nippon Petrochemicals Company, Limited, Tokyo (JP)

( * ) Notice: Subject to any disclaimer, the term of this patent is extended or adjusted under 35 U.S.C. 154(b) by 0 days.

(21) Appl. No.: 09/807,572

(22) PCT Filed: Aug. 11, 2000

(86) PCT No.: PCT/JP00/05392

§ 371 (c)(1),
(2), (4) Date: Apr. 13, 2001

(87) PCT Pub. No.: WO01/12695

PCT Pub. Date: Feb. 22, 2001

(30) Foreign Application Priority Data

Aug. 13, 1999 (JP) .............................................. 11-228992

(51) Int. Cl.[7] .............................. C08K 5/06; C08L 63/02
(52) U.S. Cl. ........................ 523/458; 529/205; 549/541; 549/542; 568/721; 568/756; 568/766
(58) Field of Search .......................... 528/205; 523/458; 568/721, 756, 766; 549/541, 542

(56) References Cited

U.S. PATENT DOCUMENTS 5,336,752 A * 8/1994 Oshimi ....................... 528/205
5,344,899 A     9/1994 Enomoto et al.

FOREIGN PATENT DOCUMENTS

| JP | 4-300916 | 10/1992 |
|----|----------|---------|
| JP | 5-5022 | 1/1993 |
| JP | 7-252349 | 10/1995 |
| JP | 8-53539 | 2/1996 |
| JP | 11-49936 | 2/1999 |
| JP | 11-199657 | 7/1999 |
| JP | 11-199659 | 7/1999 |

OTHER PUBLICATIONS

Encyclopedia of Chemical Techology, vol. 6 John Wiley & Sons, p. 847, 1993.*

D. J. Cram, G. S. Hammond, Organic Chemistry, McGraw–Hill, p. 350, 1959*

Lee and Neville, Handbook of Epoxy Resins, pp. 2–4 and 2–5, Mar. 1967.

* cited by examiner

Primary Examiner—Robert Dawson
Assistant Examiner—D. Aylward
(74) Attorney, Agent, or Firm—Hollander Law Firm, P.L.C.

(57) ABSTRACT

A process for producing a phenolic resin of good hue, characterized by reacting a hydroxylated aromatic compound with an unsaturated cyclic hydrocarbon compound in the presence of both active hydrogen and a reducing metal compound with the aid of an acid catalyst, subsequently deactivating the catalyst, and then removing the catalyst, the metal compound, and the starting materials remaining unreacted; and a process for producing an epoxy resin which comprises a step of reacting the phenolic resin with an epihalohydrin. By these processes, a phenolic resin and an epoxy resin are obtained which each is colored little and has an excellent hue. These resins are useful as resins for electrically insulating materials, especially as resins for semiconductor encapsulation materials and for laminated plates.

19 Claims, No Drawings

PHENOLIC RESIN, EPOXY RESIN, AND PROCESSES FOR PRODUCING THESE

TECHNICAL FIELD

The present invention relates to a phenolic resin having good hue or color tone and an epoxy resin that is derived from the phenolic resin, and processes for producing both the resins. The phenolic resin is prepared by reacting unsaturated cyclic hydrocarbon compounds such as dicyclopentadiene with hydroxylated aromatic compounds such as a phenolic compound.

More particularly, the invention relates to a phenolic resin and an epoxy resin, which are excellent in heat resistance, moisture resistance and crack resistance, so that they are useful as the resin materials for electrically insulating materials, especially for sealing or encapsulating semiconductors and for producing laminated materials. Furthermore, both the resins are so excellent in hue that they are useful as materials for molded products especially when the products are applied with marks.

BACKGROUND ART

Phenolic resins modified with dicyclopentadiene are produced using boron trifluoride or boron trifluoride-phenol complex as a catalyst. However, there is a problem that the resins are colored in dark brown so deeply that the external appearance of molded products is awfully disagreeable. The epoxy resin obtained by reacting the above phenolic resin with epihalohydrin in the presence of a base catalyst is similarly colored in dark brown because the phenolic resin as a starting material is colored. The resin composition for encapsulation prepared with the above epoxy resin has improved properties such as moisture resistance and heat resistance. However, it is troublesome to apply marks such as trade name, lot numbers and the like because the marks are recognized with difficulty, which seriously lowers the work efficiency.

In order to apply marks, a method using carbon dioxide laser or YAG laser is developed recently as well as the method using thermosetting ink or UV-setting ink. In the method of ink marking, printing ink is simply applied onto the surface of a resin. The method of laser marking is exemplified by the use of a thermal color former or the utilization of local vaporization phenomenon of surface with the laser heat. In the method of utilizing the local vaporization phenomenon of surface, carbon black is sometimes compounded into a sealing material (for example, Japanese Laid-Open Patent Publication No. H11-49936). In this case, it is not always required that the hue of sealing resin is good enough. However, in other methods such as the use of the above-mentioned thermal color former, it is usually preferable that the sealing resin is satisfactory in hue. That is, with preferable external appearance, an improved commercial value of product can be expected.

In order to improve the marking property, it is effective to use resins of generally yellow tinge by reducing the red tinge or black tinge as far as possible. For this reason, it has been demanded to propose a simple and easy process for producing yellowish phenolic resin that is modified with dicyclopentadiene.

For improving the hue, Japanese Laid-Open Patent Publication No. H08-53539 proposes a method in which the hue of a phenolic resin and thatof an epoxy resin obtained from the phenolic resin are improved by subjecting them to freeze drying or degassing several times. However, although this method can improve the hue of phenolic resin to a certain extent, there is a problem that a black tinge remains so that a further improvement is required as a starting material for epoxy resin. Moreover, because the above method needs process of freeze drying or degassing, the operation is complicated and requires much labor, so that the production cost is high.

In Japanese Laid-Open Patent Publication No. H07-252349, a method for improving hue is proposed, which comprises the steps of dissolving resins in an organic solvent and treating it with an inorganic porous substance. However, because the resins must be dissolved again in an organic solvent after refining by concentration, the operation is complicated and requires much labor, and the production cost is also high.

An object of the present invention is to provide a process for producing without difficulty a less colored phenolic resin satisfactory in hue by reacting a hydroxylated aromatic compound with an unsaturated cyclic hydrocarbon compound in the presence of an acid catalyst. Another object of the invention is to provide a process for producing a less colored epoxy resin satisfactory in hue similarly by reacting the phenolic resin obtained as above with an epihalohydrin in the presence of a base catalyst.

The present inventors have carried out extensive investigations in order to solve the above problems. As a result, they have found out that a phenolic resin satisfactory in hue can be obtained by reacting a hydroxylated aromatic compound with an unsaturated cyclic hydrocarbon compound in the presence of both active hydrogen and a metal compound with the aid of an acid catalyst. Furthermore, they have found out that an epoxy resin obtained by using the above phenolic resin is also excellent in hue. In view of these finding, the present invention has been accomplished.

Therefore, a first aspect of the present invention relates to a process for producing phenolic resin satisfactory in hue, that is characterized by the steps of reacting a hydroxylated aromatic compound with an unsaturated cyclic hydrocarbon compound in the presence of both active hydrogen and a reducing metal compound with the aid of an acid catalyst, subsequently deactivating the catalyst, and then removing the catalyst, the metal compound, and the unreacted hydroxylated aromatic compound.

A second aspect of the present invention relates to a process for producing a phenolic resin as described in the first aspect, wherein the acid catalyst is a Friedel-Crafts catalyst containing boron trifluoride.

A third aspect of the present invention relates to a process for producing a phenolic resin as described in the first aspect or in the second aspect, wherein the hydroxylated aromatic compound is monohydric phenol or dihydric phenol, and the unsaturated cyclic hydrocarbon compound is dicyclopentadiene.

A fourth aspect of the present invention relates to a process for producing an epoxy resin satisfactory in hue, that is characterized by the steps of reacting the phenolic resin obtained by a method as described in any of the first aspect to the third aspect with epihalohydrin with the aid of a base catalyst, and then removing the catalyst and the unreacted epihalohydrin.

A fifth aspect of the present invention relates to a phenolic resin satisfactory in hue obtained by the steps of reacting a hydroxylated aromatic compound with an unsaturated cyclic hydrocarbon compound with the aid of an acid catalyst, the resin having the absorbance of 0.5 or less at the wavelength of 350 nm and the absorbance of 0.1 or less at the wavelength of 430 nm in the measurement of absorptiometry in an ultraviolet-visible ray region using 2% solution of the refined resin in dioxane.

A sixth aspect of the present invention relates to an epoxy resin satisfactory in hue obtained by reacting a phenolic resin that is obtained by reacting a hydroxylated aromatic compound with an unsaturated cyclic hydrocarbon compound with the aid of an acid catalyst, with an epihalohydrin with the aid of a base catalyst, the epoxy resin having the absorbance of 0.5 or less at the wavelength of 350 nm and the absorbance of 0.1 or less at the wavelength of 430 nm in the measurement of absorptiometry in ultraviolet-visible ray region using 2% solution of the refined resin in dioxane.

By working a process as described in any of the first to fourth aspects, the phenolic resin or the epoxy resin satisfactory in hue as described in the fifth or sixth aspect can be obtained.

The phenolic resin and the epoxy resin obtained according to the present invention have little tinge of red or black in hue and high transparency by visual observation. Therefore, the appearance is excellent, so that the commercial value is high and the marking property is also satisfactory.

DISCLOSURE OF INVENTION

In the following, the present invention will be described in more detail.

In the process for producing epoxy resin according to the present invention, in the first place, phenolic resin is produced as an intermediate material according to the method described below.

The phenolic resin according to the present invention is produced by reacting a hydroxylated aromatic hydrocarbon compound. More particularly, the phenolic compound having phenolic hydroxyl group and an unsaturated cyclic hydrocarbon compound, preferably unsaturated cyclic hydrocarbon compound, having 2 or more of carbon-carbon double bonds are reacted in the presence of an acid catalyst.

Unsaturated cyclic hydrocarbon compounds used as a starting material of phenolic resin according to the present invention are exemplified specifically by dicyclopentadiene, 4-vinylcyclohexene, 5-vinylnorborn-2-ene, 3a,4,7,7a-tetrahydroindene, α-pinene, and limonene Dicyclopentadience is particular favorable because the obtained resin is excellent in heat resistance, moisture resistance and mechanical properties.

Hydroxylated aromatic hydrocarbon compounds are specifically phenolic compounds, but they are not particularly limited. As phenolic compounds, there are, for example, monohydric phenols such as phenol, o-cresol, m-cresol, p-cresol, o-ethylphenol, m-ethylphenol, p-ethylphenol, o-propylphenol, m-propylphenol, p-propylphenol, p-sec-butylphenol, p-tert-butylphenol, p-cyclohexylphenol, p-chlorophenol, o-bromophenol, m-bromophenol, p-bromophenol, α-naphthol and β-naphthol; dihydric phenols such as resorcin, catechol, hydroquinone, 2,2-bis (4'-hydroxyphenyl)propane, bis(hydroxyphenyl)-methane, tetramethylbiphenol and biphenol; trihydric phenols such as tris(hydroxyphenyl)methane; and the mixtures of them.

Among them, phenol, o-cresol, m-cresol, α-naphthol, β-naphthol and 2,2-bis(4'-hydroxyphenyl)propane are particularly desirable because they are economical and easy to be produced.

In the reaction of unsaturated cyclic hydrocarbon compound with hydroxylated aromatic compound, it is possible to adjust the molecular weight and melt viscosity to appropriate ranges by changing the mixing ratio (molar ratio) of both the components. The molar ratio is not particularly limited. However, it is usually preferable that the molar ratio of hydroxylated aromatic compound/unsaturated cyclic hydrocarbon compound is in the range of (1 to 20)/1.

When the amount of unsaturated cyclic hydrocarbon is small, the molecular weight decreases so that the melt viscosity is reduced. In the use as materials for semiconductor encapsulation, the resins can be filled with large quantities of fillers, so that they have preferably low coefficient of linear expansion and high water resisting property. Specifically, the molar ratio of hydroxylated aromatic compound/unsaturated cyclic hydrocarbon compound is preferably in the range of (1 to 15)/1.

As acid catalysts used for producing phenolic resins according to the present invention, there are inorganic acids such as hydrochloric acid, sulfuric acid and nitric acid, and organic acids such as formic acid, acetic acid and oxalic acid. As Friedel-Crafts catalysts, there are boron trifluoride, boron trifluoride-ether complex, boron trifluoride-phenol complex, boron trifluoride-water complex, boron trifluoride-alcohol complex, boron trifluoride-amine complex and the like. Furthermore, the mixtures of them are also used preferably. Among all these, boron trifluoride, boron trifluoride-phenol complex and boron trifluoride-ether complex are particularly favorable, because they are high in activity and easy to remove.

The molecular weight and the melt viscosity can be adjusted to suitable ranges by changing the amount of the above-mentioned catalyst appropriately. As to particular amount of catalyst, for example, when boron trifluoride-phenol complex is used as catalyst in a reaction between phenol and dicyclopentadiene, the ratio of boron trifluoride/(phenol+dicyclopentadiene+boron trifluoride) can be selected appropriately in the range of from 0.001 to 2.0% by weight. The range of from 0.15 to 1.00% by weight is practically used so that the finally obtained resin can present favorable properties in use.

As to hydroxylated aromatic compounds used for producing phenolic resins, it is preferable to keep the water content at 100 ppm or less in order to prevent side reactions. For this purpose, it is preferable to dehydrate hydroxylated aromatic compounds before use. The method of dehydration is not particularly limited. For example, the formation of azeotropic mixture of a hydroxylated aromatic compound with an organic solvent is carried out under nitrogen flow.

Furthermore, during a period of producing phenolic resin, it is preferable to replace gas in a reaction vessel by inert gas. Not only in the case of closed system, but also in the case of open system, it is preferable to replace gas in a reaction system by inert gas as completely as possible. As inert gases to be used herein, there are nitrogen, argon, helium and the like.

The above reaction of phenolic compound and unsaturated cyclic hydrocarbon compound can be carried out either with or without solvent. When solvent is not used, phenolic compound is preferably used as a substitute for solvent in the same moles as those of unsaturated cyclic hydrocarbon compound or more, particularly 3 to 15 times.

When solvents are used, they are not particularly limited as long as they do not hinder the reaction. As particularly favorable solvents, there are aromatic hydrocarbon compounds such as benzene, toluene and xylene. The amount of a solvent to be used in this case is preferably 20 to 3000 parts by weight relative to 100 parts by weight of hydroxylated aromatic compound.

In the present invention, the hydroxylated aromatic compound such as phenolic compound and the unsaturated cyclic hydrocarbon compound are caused to react in the presence of an acid catalyst to produce an intended phenolic resin. The order of adding phenolic compound and unsaturated cyclic hydrocarbon compound is optional. For example, when a reaction is operated in batch system, both of the following methods can be applied. In one case, phenolic compound and unsaturated cyclic hydrocarbon compound are put into a reaction vessel simultaneously. In another case, phenolic compound is put into a reaction vessel at first, then unsaturated cyclic hydrocarbon compound is added intermittently or continuously to initiate the reaction. However, in the above case of batch system, it is preferable to supply phenolic compound at first, then supply unsaturated cyclic hydrocarbon compound intermittently or continuously.

As to reaction conditions, the reaction temperature can be selected from the range from the melting point of phenolic compound to 200° C., and the retention time of reaction can be selected from the range of 10 minutes to 100 hours, appropriately in both cases. When the reaction temperature exceeds 200° C., decomposition of catalyst or side reaction occurs. On the other hand, when the reaction temperature is less than the melting point of phenolic compound, the reaction requires a long time, which is disadvantageous economically. Both cases are not favorable.

If necessary, reaction can be carried out by using plural separated steps. For example, in the case of two step reaction, at first the reaction can be carried out in the range of temperature from any higher temperature of the melting point of phenolic compound and 50° C. to 100° C., and in the next step, the reaction can be carried out at the temperature higher than that of the first step by 20° C. or more, preferably by 30° C. or more. Specifically, the temperature of the latter step is set higher than 120° C., preferably in the range of 120 to 170° C.

The present invention is characterized by that both active hydrogen and specific reducing metal compound are caused to be present during the reaction of a phenolic compound with an unsaturated cyclic hydrocarbon compound.

The reducing metal compounds to be added are not particularly limited. Reducing metal compounds used for hydrogenation or catalytic reduction are suitable. As preferable examples, there are alkali metals represented by sodium, alkaline earth metals such as calcium and magnesium, and other metals such as zinc, tin and iron. Among them, zinc is particularly favorable because it presents satisfactory decoloring effect and the workability is excellent. Solid metals are convenient in the form of powder, so that zinc powder is used favorably.

The amount of reducing metal compound is not particularly limited as long as decoloring effect can be obtained. When it is used in the range of 0.01 to 10% by weight, more preferably 0.1 to 5% by weight relative to the resin obtained after final refining, a satisfactorily decolored resin can be obtained without causing decrease of work efficiency in practical use. If the amount is less than this range, it is difficult to obtain the decoloring effect in a satisfactory level. On the other hand, even if the amount is more than this range, the effect is not increased in particular, and besides, the filtration of residual metals requires a long time. Accordingly, both cases are not favorable.

The metals can be used in various shapes such as fine powder, petal, sphere and lump. Whichever shape is used, favorable decoloring effect is obtained. However, when metals are in the shape of fine powder that has sufficient surface area and high contact efficiency, highly decolored resins can be obtained most effectively.

Other than above, metal plates having porous surface, these plates carrying other metals and galvanized plates can be used similarly in the metal treatment according to the present invention.

The time to add reducing metal compounds is not particularly limited. For example, reducing metal compounds can be added at the time when the whole amount of starting materials is supplied, or later. Otherwise, they can be added at the time when unsaturated cyclic hydrocarbon compound is supplied after the supply of phenolic compound, or later. In a word, at the time when phenolic compound and unsaturated cyclic hydrocarbon compound are caused to react, it is required that both a reducing metal compound and active hydrogen are present in a reaction system.

Incidentally, the reaction of hydroxylated aromatic compound and unsaturated cyclic hydrocarbon compound according to the present invention includes a rearrangement reaction of the once produced addition product as well as an addition reaction. In the rearrangement reaction, a reducing metal compound and the active hydrogen described below are also required.

In the process according to the present invention, the presence of active hydrogen is necessary as well as reducing metal compound. Usually, because the hydroxylated aromatic compound existing in excess serves as a source of active hydrogen, it is not necessary to supply another source of active hydrogen. However, when it is desired to promote decolorization further, a source of active hydrogen can be supplied separately.

As the above source of active hydrogen, acids and alcohols are used. The kinds of them are not limited in particular, however decolorization is remarkably promoted when the following compounds are used. They include inorganic acids such as hydrochloric acid, sulfuric acid and nitric acid; organic acids such as formic acid, acetic acid and oxalic acid; alkanols such as methanol, ethanol, propanol, isopropanol and butanol; and hydroxylated aromatic compounds such as phenol. Among them, formic acid or ethanol is favorably used from the viewpoint of the treatment efficiency after the reaction.

When a source of active hydrogen is added separately from hydroxylated aromatic compounds as starting material, decolorization can be promoted by adjusting the amount in the range from the same weight as that of reducing metal compounds to about 3 times, especially in the range from 1.5 times to twice.

In the process for producing a phenolic resin according to the present invention, it is necessary only to cause hydroxylated aromatic compounds to react with unsaturated cyclic hydrocarbon compounds under the above-mentioned conditions and to carry out the treatment with reducing metal compounds and active hydrogen efficiently during the reaction. Methods of reaction are not limited particularly.

Considering all the above factors, a preferable batch-type process for producing phenolic resin according to the present invention is as follows.

(1) A phenolic compound is supplied in the presence of an acid catalyst, and an unsaturated cyclic hydrocarbon compound is added intermittently or continuously in the range of temperature from any higher temperature of the melting point of the phenolic compound and 50° C. to 100° C. to carry out an addition reaction, (2) a reducing metal compound is added, and then (3) the reaction temperature is increased up to 120° C., preferably in the range of 120 to 170° C. to facilitate the reaction.

After a phenolic resin is produced as above, deactivation of catalyst is carried out.

Though the procedure for deactivation is not especially limited, it is favorable to use the one in which the amount of the residual ionic impurity such as boron and fluorine in the finally obtained resin is reduced to 100 ppm or less. For this purpose, deactivating agents can be selected from inorganic bases such as alkali metals, alkaline earth metals, and their oxides, hydroxides and carbonates, and further ammonium hydroxide and ammonia gas. Among them, hydrotalcites are used preferably, because the treatment is simple and prompt, and moreover, the amount of residual ionic impurity after treatment is small.

When the used deactivating agent can be removed by filtration, it will be advantageous because the deactivating agent can be removed together with the residual reducing metal compound. The above-mentioned hydrotalcite is favorable as deactivating agent, because it can be removed by filtration.

In carrying out filtration, workability can be improved by adding solvents or carrying out the treatment of heating a filtration mixture. Furthermore, workability can be also improved by increasing or reducing the pressure inside of the system.

The finally obtained reaction liquid as mentioned above that does not contain impurity can be concentrated with distillation to obtain a highly pure hydrocarbon-phenol resin having an improved hue. Distillation can be carried out at atmospheric pressure, but it can be also carried out under increased or reduced pressure in order to improve the workability.

As the method for evaluating the hue of the obtained resin, the method of using Gardner standard solution according to JIS K5400 is the one for testing hue of a solution. Therefore, the results of evaluation are often inconsistent with the hue of actual solid resin. In addition, because the measurement is done on the basis of comparison with standard color solutions, the standards and results of evaluation vary depending on test persons. On the contrary, with the method using absorptiometry in the region of ultraviolet rays and visible rays, variation among results is small and the correlation between measured value and actual hue is high. Therefore, this method is adopted for the hue estimation in the present invention.

Next, the absorptiometry by ultraviolet and visible rays will be explained. In this method, diluted solutions are used, which contain resins dissolved in arbitrary solvents. As the resin, the one after refined (after deactivation of catalyst) is used. Suitable diluting solvents have small absorption over the whole region of ultraviolet rays and visible rays. Accordingly, aliphatic saturated hydrocarbon, aliphatic saturated hydrocarbon ether or the like is used preferably. However, dioxane and tetrahydrofuran are particularly favorable because of their large dissolving power for resins.

The absorbance is measured at wavelength 350 nm and 430 nm and the hue is estimated with this result. The present resin satisfactory in hue has the most remarkable characteristic in the absorbance at wavelength 350 nm and 430 nm. That is, the resins that have both the absorbance of 0.5 or lower at wavelength 350 nm and the absorbance of 0.1 or lower at wavelength 430 nm are good in actual hue, and are useful as a raw material for producing epoxy resin in the subsequent reaction.

The phenolic resins obtained as above are useful as curing agent of epoxy resin for electrically insulating materials, especially materials for semiconductor encapsulation or materials for laminated plates, or as raw material for epoxy resins. The molded products are good in external appearance and in marking property because of their excellent hue. However, the use is not particularly limited to the above.

In the following, a process for producing epoxy resin satisfactory in hue will be explained.

The present epoxy resin having excellent hue can be obtained by reacting the phenolic resin having good hue obtained as above with an epihalohydrin in the presence of a base catalyst by the conventional procedure to introduce glycidyl group.

The reaction of introducing glycidyl group is carried out by the conventional procedure. Definitely, for instance, the phenolic resin is reacted with a glycidyl group-containing agent such as epichlorohydrin or epibromohydrin in the presence of a base such as sodium hydroxide or potassium hydroxide, usually at 10 to 150° C., preferably at 30 to 80° C. Then, the reaction product is washed with water and dried to obtain an epoxy resin.

Here, the amount of glycidyl group-introducing agent is preferably 2 to 20 times, particularly 3 to 7 times, the moles of hydroxyl group of phenolic resin.

During the reaction period, the reaction can be accelerated by removing water using azeotropic distillation with the glycidyl group-introducing agent under reduced pressure.

When the present epoxy resin is used in a field of electronic parts, sodium chloride produced as a by-product in epoxidation must be removed completely in the water-washing step. At this time, after glycidyl group-introducing agents are recovered by distillation to concentrate the reaction solution, the concentrated product may be dissolved in a solvent and washed with water. As the solvents, methyl isobutyl ketone, cyclohexanone, benzene, butyl cellosolve and the like are preferable. Epoxy resin is obtained by concentrating with heating the washed concentrate.

The epoxy equivalent (g-resin/gram equivalent-epoxy group) of the above epoxy resin is usually 200 to 500, preferably 2560 to 450. If epoxy equivalent exceeds 500, cross-linking density decreases unfavorably.

The epoxy resins obtained as above according to the present invention are superior to the epoxy resins having similar structure obtained by the conventional method, in hue, external appearance and marking property of molded products. There is not a black tinge in external appearance of the resin. The epoxy resins having the absorbance of 0.5 or lower at wavelength 350 nm and the absorbance of 0.1 at wavelength 430 nm measured by the above method using 2% solution in dioxane are good also in actual hue.

Because the above epoxy resins are excellent in hue, the molded products are good in external appearance and marking property. Therefore, they are useful as epoxy resin composition materials for electrically insulating materials, especially materials for semiconductor encapsulation and materials for laminated plates. However, their uses are not limited only to these, but they are also used for powdery paint, brake shoes and so forth.

BEST METHOD FOR CARRYING OUT THE INVENTION

In the following, the present invention will be described in more detail with reference to examples and comparative examples.

Properties of phenolic resins and epoxy resins in the following examples and comparative examples were measured according to the following methods.

(1) Absorbance of Ultraviolet and Visible Ray

The measurement was carried out using the following measuring instruments and a sample.

Analyzer: ultraviolet-visible ray spectrophotometer (trade name: Ubest-50, made by Jasco Corp.).

Measuring cell: made of quartz, optical path length 10 mm

Sample preparation: a diluted solution of 2% by weight in dioxane (2) Hue

Test pieces in the form of disk having diameter 65 mm x thickness 12 mm were prepared, and the results were determined by visual observation.

(3) Transparency

Test plates were the same as those used in the measurement of hue.

A sentence written using a software of word processor (trade name: Microsoft Word 97) was printed on an ordinary paper (in the fastest mode) with an ink-jet printer (trade name: MJ 930) made by Seiko Epson Co., Ltd. The paper was laid on a test plate, and scanning was carried out (full color, 300 dpi) with a flat bed scanner (trade name: CANOSCAN 600) made by Canon Inc., and the character sizes (point) that can be distinguished on the display were determined.

EXAMPLE 1

(Production of Phenolic Resin-1)

Phenol and toluene were put into a reaction vessel and heated to 160° C., so that toluene was caused to form an azeotropic mixture with water. Dehydration was carried out until the moisture in the reaction system became 100 ppm or less, while toluene was distilled away. The amount of phenol after dehydration was 780 g.

After the temperature of liquid was adjusted to 70° C. and 5.2 g (0.58%) of boron trifluoride-phenol complex was added, 115 g of dicyclopentadiene was added dropwise slowly in an hour while the liquid temperature was kept 70° C.

After adding dropwise, stirring was carried out for an hour under the same conditions. Then, 5.0 g of zinc powder was added in the system, thereafter the mixture was heated up to 140° C. and stirred further for 8 hours. As a result, it was confirmed that the color of the reaction liquid changed from dark red to light orange.

After the reaction, the reaction liquid was cooled to 70° C. Then, 15 g of hydrotalcite (trade name: Kyowaad 1000, made by Kyowa Chemical Industry Co., Ltd.) was added and the mixture was stirred at 70° C. for an hour to deactivate catalysts. Then, the reaction liquid was filtered. The obtained filtrate was concentrated by vacuum distillation to obtain 250 g of a phenolic resin.

The softening point of the obtained phenolic resin by means of ring and ball method was 89° C., and the phenolic hydroxyl equivalent (gram-resin/gram equivalent-hydroxyl group) was 169. The obtained resin was tinged with light yellow on the whole without a black tinge and high in transparency. As the result of measuring the absorbance, the absorbance at wavelength 350 nm was 0.05, and the absorbance at 430 nm was 0.01 or less.

EXAMPLE 2

(Production of Epoxy Resin-1)

In a four neck flask having capacity of 3 liter equipped with stirrer, refluxing condenser and thermometer were put 169 g of the phenolic resin produced according to the procedure described in Example 1 and 400 g of epichlorohydrin, then they were dissolved and stirred. The reaction system was adjusted to pressure of 150 mmHg and heated up to 68° C. Into this system was added continuously 100 g of an aqueous solution of sodium hydroxide having the concentration of 48% by weight, while a reaction was carried out for 3.5 hours. Both the water generated by reaction and that contained in the aqueous solution of sodium hydroxide were decomposed by refluxing the azeotropic mixture of water-epichlorohydrin and removed continuously from the reaction system. After the reaction, the pressure of the reaction system was set back to atmospheric pressure, and the temperature was increased to 110° C. to remove the water in the reaction system completely. Excess epichlorohydrin was distilled away under atmospheric pressure, and furthermore, distillation was carried out under reduced pressure of 15 mmHg at 140° C.

To the obtained mixture of resin and sodium chloride were added 300 g of methyl isobutyl ketone and 36 g of an aqueous solution of sodium hydroxide of 10% by weight, and a reaction was carried out for 1.5 hours at 85° C. After the reaction, 750 g of methyl isobutyl ketone and 300 g of water were added, then the lower layer of aqueous solution of sodium chloride was removed by separation. Next, the layer of methyl isobutyl ketone was washed with 150 g of water and neutralized with phosphoric acid, and the water layer was removed. Furthermore, 800 g of water was added for washing, and the water layer was removed. The separation of oil layer and water layer was satisfactory, and inorganic salts were recovered quantitatively. The layer of methyl isobutyl ketone was distilled under atmospheric pressure, subsequently vacuum distillation was carried out under the pressure of 5 mmHg at 140° C. to obtain 216 g of an epoxy resin. Th epoxy equivalent of the epoxy resin was 266.

The resin was tinged with light yellow on the whole without a black tinge and high in transparency. As the result of measuring the absorbance, the absorbance at wavelength 350 nm was 0.04, and the absorbance at 430 nm was 0.01 or less.

EXAMPLE 3

(Production of Phenolic Resin-2)

Phenol and toluene were put into a reaction vessel and heated to 160° C., so that toluene was caused to form an azeotropic mixture with water. Dehydration was carried out until the moisture in the reaction system became 100 ppm or less, while toluene was distilled away. The amount of phenol after dehydration was 800 g.

After the temperature of liquid was adjusted to 70° C. and 2.3 g (0.25%) of boron trifluoride-phenol complex was added, 115 g of dicyclopentadiene was added dropwise slowly in an hour while the liquid temperature was kept 70° C.

After adding dropwise, stirring was carried out for an hour under the same conditions. Then, 1.3 g of zinc powder was added in the system, thereafter the mixture was heated up to 140° C. and stirred further for 8 hours. As a result, it was confirmed that the color of the reaction liquid changed from dark red to light orange.

After the reaction, the reaction liquid was cooled to 70° C. Then, 8 g of hydrotalcite (trade name: Kyowaad 1000, made by Kyowa Chemical Industry Co., Ltd.) was added and the mixture was stirred at 70° C. for an hour to deactivate catalysts. Then, the reaction liquid was filtered. The obtained filtrate was concentrated by vacuum distillation to obtain 245 g of a phenolic resin.

The softening point of the obtained phenolic resin was 89.0° C., and the phenolic hydroxyl equivalent was 168. The obtained resin was tinged with light yellow on the whole without a black tinge and high in transparency. As the result of measuring the absorbance, the absorbance at wavelength 350 nm was 0.06, and the absorbance at 430 nm was 0.01 or less.

EXAMPLE 4
(Synthesis of Epoxy Resin-2)

Procedures similar to those of Example 2 were conducted except that 169 g of the phenolic resin synthesized in Example 3 was used, and 221 g of an epoxy resin was obtained. The epoxy equivalent of the epoxy resin was 267. The obtained resin was light yellow in color and had a high transparency. The absorbance at wavelength 350 nm was 0.05, and the absorbance at wavelength 430 nm was 0.01 or less.

EXAMPLE 5
(Production of Phenolic Resin-3)

Phenol and toluene were put into a reaction vessel and heated to 160° C., so that toluene was caused to form an azeotropic mixture with water. Dehydration was carried out until the moisture in the reaction system became 100 ppm or less, while toluene was distilled away. The amount of phenol after dehydration was 750 g.

The temperature of liquid was adjusted to 70° C. and 6 g (0.68%) of boron trifluoride-phenol complex was added. After the mixture was homogenized, 130 g of dicyclopentadiene was added dropwise slowly in an hour while the liquid temperature was kept 70° C.

After adding dropwise, stirring was carried out for an hour under the same conditions. Then, 5.7 g of zinc powder and 5.7 g of formic acid were added, thereafter the mixture was heated up to 140° C. and stirred further for 3 hours. As a result, it was confirmed that the color of the reaction liquid changed from dark reddish brown to light yellow.

After the reaction, the reaction liquid was cooled to 70° C. Then, 15 g of hydrotalcite (trade name: Kyowaad 1000, made by Kyowa Chemical Industry Co., Ltd.) was added and the mixture was stirred at 70° C. for an hour to deactivate catalysts. Then, filtration was carried out to remove the deactivating agent and catalysts. The obtained filtrate was concentrated by vacuum distillation to obtain 250 g of a phenolic resin.

The softening point of the obtained phenolic resin was 89° C., and the phenolic hydroxyl equivalent was 170. The resin was tinged with light yellow on the whole without a black tinge and high in transparency. The absorbance at wavelength 350 nm was 0.04, and the absorbance at 430 nm was 0.01 or less.

EXAMPLE 6
(Synthesis of Epoxy Resin-3)

Procedures similar to those of Example 2 were conducted except that 170 g of the phenolic resin synthesized in Example 5 was used, and 223 g of an epoxy resin was obtained. The epoxy equivalent of the epoxy resin was 269. The obtained resin was light yellow in color and had a high transparency. The absorbance at wavelength 350 nm was 0.04, and the absorbance at 430 nm was 0.01 or less.

EXAMPLE 7
(Production of Phenolic Resin-4)

Phenol and toluene were put into a reaction vessel and heated to 160° C., so that toluene was caused to form an azeotropic mixture with water. Dehydration was carried out until the moisture in the reaction system became 100 ppm or less, while toluene was distilled away. The amount of phenol after dehydration was 850 g.

The temperature of liquid was adjusted to 70° C. and 6 g (0.61%) of boron trifluoride-phenol complex was added. After the mixture was homogenized, 125 g of dicyclopentadiene was added dropwise slowly in an hour while the liquid temperature was kept 70° C.

After adding dropwise, the temperature in the system was heated up to 140° C. and stirring was continued for 3 hours. Then, 5.5 g of zinc powder and 5.7 g of formic acid were added in the system, thereafter the liquid was heated up to 140° C. and stirred further for 3 hours. As a result, it was confirmed that the color of the reaction liquid changed from dark reddish brown to orange.

After the reaction, the reaction liquid was cooled to 70° C. Then, 15 g of hydrotalcite (trade name: Kyowaad 1000, made by Kyowa Chemical Industry Co., Ltd.) was added and the mixture was stirred at 70° C. for an hour to deactivate catalysts. Then, filtration was carried out to remove the deactivating agent and catalysts. The obtained filtrate was concentrated by vacuum distillation to obtain 270 g of a phenolic resin.

The softening point of the obtained phenolic resin was 89° C., and the phenolic hydroxyl equivalent was 170. The resin was tinged with orange on the whole and had no black tinge. The absorbance at wavelength 350 nm was 0.42, and the absorbance at 430 nm was 0.01 or less.

EXAMPLE 8
(Synthesis of Epoxy Resin-4)

Procedures similar to those of Example 2 were conducted except that 170 g of the phenolic resin synthesized in Example 7 was used, and 218 g of an epoxy resin was obtained. The epoxy equivalent of the epoxy resin was 267. The obtained resin was light yellow in color and had a high transparency. The absorbance at wavelength 350 nm was 0.33, and the absorbance at 430 nm was 0.01 or less.

COMPARATIVE EXAMPLE 1
(Synthesis of Phenolic Resin-5)

Phenol and toluene were put into a reaction vessel and dehydration by azeotropic distillation was carried out in the similar way to that of Example 1. The amount of phenol after dehydration was 760 g. Then, 6.0 g (0.2%) of boron trifluoride was added, and 135 g of dicyclopentadiene was added dropwise. Procedures similar to those of Example 1 were carried out to obtain 290 g of a phenolic resin.

The softening point of the phenolic resin was 90.0° C., and the phenolic equivalent was 168. The obtained resin was dark brown in color and rather low in transparency. As the result of measuring the absorbance, the absorbance at wavelength 350 nm was 1.85, and the absorbance at 430 nm was 1.13.

COMPARATIVE EXAMPLE 2
(Synthesis of Epoxy Resin-5)

Procedures similar to those of Example 2 were conducted except that 168 g of the phenolic resin synthesized in Comparative Example 1 was used, and 220 g of an epoxy resin was obtained. The epoxy equivalent of the epoxy resin was 266. The obtained resin was brown in color and scarcely had transparency. The absorbance at wavelength 350 nm was 1.11, and the absorbance at 430 nm was 0.73.

As to the phenolic resins and epoxy resins obtained in Examples 1 to 8 and Comparative Examples 1 and 2, the results of measurement of absorbance, hue and transparency will be shown in Table 1.

TABLE 1

Properties of Phenolic Resin and Epoxy Resin

|  | Absorbance | | Hue | | |
|---|---|---|---|---|---|
|  | 350 nm | 430 nm | Color | Black Tinge | Transparency |
| Phenolic Resin | | | | | |
| Example 1 | 0.05 | 0.01 or less | Light Yellow | None | 4 |
| Example 3 | 0.06 | 0.01 or less | Light Yellow | None | 4 |
| Example 5 | 0.04 | 0.01 or less | Light Yellow | None | 4 |
| Example 7 | 0.42 | 0.01 or less | Orange | None | 5 |
| Comp. Ex. 1 | 1.85 | 1.13 | Dark Brown | Detected | 48 or more |
| Epoxy Resin | | | | | |
| Example 2 | 0.04 | 0.01 or less | Light Yellow | None | 4 |
| Example 4 | 0.05 | 0.01 or less | Light Yellow | None | 4 |
| Example 6 | 0.04 | 0.01 or less | Light Yellow | None | 4 |
| Example 8 | 0.33 | 0.01 or less | Light Yellow | None | 5 |
| Comp. Ex. 2 | 1.11 | 0.73 | Brown | Detected | 48 or more |

INDUSTRIAL APPLICABILITY

According to the present invention, a hydroxylated aromatic compound and an unsaturated cyclic hydrocarbon compound are caused to react in the presence of both a reducing metal compound and active hydrogen with the aid of an acid catalyst to obtain a phenolic resin. The obtained resin has the absorbance at wavelength 350 nm of 0.5 or less in 2% solution in dioxane, and is excellent in moisture resistance, heat resistance and crack resistance. In addition, the resin is excellent in hue so that the molded products are satisfactory in external appearance and marking property. Moreover, the resin has an excellent characteristic in absorbing ultraviolet rays so that it is suitable for the use as photosensitive resin such as solder regist.

Furthermore, an epoxy resin, which is obtained by adding glycidyl group to the phenolic resin obtained by the above method, is excellent in moisture resistance and electrical property. Therefore, the cured material obtained by the use of this resin is excellent in moisture resistance, and useful as resins for semiconductor, laminates for substrate of printed wiring, powdery paint, brake shoe and so forth. Moreover, because the absorbance at wavelength 350 nm of 2% solution in dioxane is 0.5 or less and the hue is excellent, the molded products are satisfactory in external appearance and making property. Furthermore, the epoxy resin has an excellent characteristic in absorbing ultraviolet rays so that it is useful as photosensitive resin such as solder regist.

In addition, the phenolic resin and epoxy resin obtained by the process according to the present invention have little tinge of red or black in hue and high transparency by visual observation, so that the product is excellent in external appearance and has a high commercial value.

What is claimed is:

1. A process for producing phenolic resin of good hue, which comprises the steps of:
   reacting a hydroxylated aromatic compound with an unsaturated cyclic hydrocarbon compound in the presence of both active hydrogen and a reducing metal or metal compound with the aid of an acid catalyst that is different from the reducing metal or metal compound,
   subsequently deactivating the catalyst, and
   removing the catalyst, said reducing metal or metal compound and the unreacted hydroxylated aromatic compound.

2. A process for producing a phenolic resin of good hue, comprising:
   reacting a hydroxylated aromatic compound with an unsaturated cyclic hydrocarbon compound in the presence of both active hydrogen and a reducing metal or metal compound with the aid of an acid catalyst;
   subsequently deactivating the catalyst; and
   removing the catalyst, said reducing metal or metal compound, and the unreacted hydroxylated aromatic compound,
   wherein said acid catalyst is a Friedel-Crafts catalyst containing boron trifluoride.

3. A process for producing a phenolic resin as claimed in claim 1, wherein said hydroxylated aromatic compound is monohydric phenol or dihydric phenol, and said unsaturated cyclic hydrocarbon compound is dicyclopentadiene.

4. A process for producing an epoxy resin of good hue, which comprises the steps of:
   reacting (1) a phenolic resin obtained by reacting a hydroxylated aromatic compound with an unsaturated cyclic hydrocarbon compound in the presence of both active hydrogen and a reducing metal or metal compound with the aid of an acid catalyst, subsequently deactivating the catalyst, and then removing the catalyst, said reducing metal or metal compound, and the unreacted hydroxylated aromatic compound, with (2) an epihalohydrin with the aid of a base catalyst, and removing the base catalyst and unreacted epihalohydrin.

5. A phenolic resin of good hue obtained by reacting a hydroxylated aromatic compound with an unsaturated cyclic hydrocarbon compound with the aid of an acid catalyst, said resin having an absorbance of 0.5 or less at the wavelength of 350 nm and an absorbance of 0.1 or less at the wavelength of 430 nm in absorptiometry with ultraviolet-visible rays using a 2% solution of refined resin in dioxane.

6. An epoxy resin of good hue obtained by reacting a phenolic resin, which is obtained by reacting a hydroxylated aromatic compound with an unsaturated cyclic hydrocarbon compound with the aid of an acid catalyst, with an epihalohydrin with the aid of a base catalyst, said epoxy resin having an absorbance of 0.5 or less at the wavelength of 350 nm and an absorbance of 0.1 or less at the wavelength of 430 nm in absorptiometry with ultraviolet-visible rays using a 2% solution of the refined resin in dioxane.

7. A process for producing a phenolic resin as claimed in claim 2, wherein said hydroxylated aromatic compound is monohydric phenol or dihydric phenol, and said unsaturated cyclic hydrocarbon compound is dicyclopentadiene.

8. A process for producing an epoxy resin of good hue, which comprises the steps of reacting the phenolic resin obtained by the method as claimed in claim 2 with an epihalohydrin with the aid of a base catalyst, and then removing the catalyst and unreacted epihalohydrin.

9. process for producing an epoxy resin of good hue, which comprises the steps of:
   reacting (1) a phenolic resin obtained by reacting monohydric phenol or dihydric phenol with dicyclopentadiene in the presence of both active hydrogen and a reducing metal or metal compound with the aid of an acid catalyst, subsequently deactivating the catalyst, and then removing the catalyst, said reducing metal or metal compound, and the unreacted monohydric phenol or dihydric phenol, with (2) an epihalohy drin with the aid of a base catalyst, and removing the base catalyst and unreacted epihalohydrin.

10. A process for producing an epoxy resin of good hue, which comprises the steps of reacting the phenolic resin obtained by the method as claimed in claim 7 with an epihalohydrin with the aid of a base catalyst, and then removing the catalyst and unreacted epihalohydrin.

11. A process for producing a phenolic resin as claimed in claim 1, wherein a source of the active hydrogen is different from the hydroxylated aromatic compound.

12. A process for producing a phenolic resin as claimed in claim 1, wherein the reducing metal or metal compound comprises a metal selected from the group consisting of alkali metals, alkaline earth metals, zinc, and tin.

13. A process for producing a phenolic resin as claimed in claim 1, wherein the acid catalyst is an inorganic acid or an organic acid.

14. A process for producing a phenolic resin as claimed in claim 13, wherein the inorganic acid is selected from the group consisting of hydrochloric acid, sulfuric acid, and nitric acid.

15. A process for producing a phenolic resin as claimed in claim 13, wherein the organic acid is selected from the group consisting of formic acid, acetic acid, and oxalic acid.

16. A process for producing a phenolic resin as claimed in claim 1, wherein the amount of the reducing metal or metal compound is 0.01 to 10% by weight relative to the phenolic resin.

17. A process for producing a phenolic resin, comprising:

reacting a hydroxylated aromatic compound with an unsaturated cyclic hydrocarbon compound in the presence of a reducing metal or metal compound with the aid of an acid catalyst that is different from the reducing metal or metal compound;

subsequently deactivating the acid catalyst; and removing the acid catalyst, the reducing metal or metal compound, and the unreacted hydroxylated aromatic compound.

18. A process for producing a phenolic resin, comprising:

reacting a hydroxylated aromatic compound with an unsaturated cyclic hydrocarbon compound in the presence of a metal selected from the group consisting of alkali metals, alkaline earth metals, zinc, and tin, and optionally active hydrogen, with the aid of an acid catalyst;

subsequently deactivating the acid catalyst; and removing the acid catalyst, the metal, and the unreacted hydroxylated aromatic compound.

19. A process for producing a phenolic resin as claimed in claim 18, wherein the metal comprises zinc powder.

* * * * *